United States Patent
Baptist et al.

(10) Patent No.: US 7,820,461 B2
(45) Date of Patent: Oct. 26, 2010

(54) SEMICONDUCTOR DEVICE WITH VERTICAL ELECTRON INJECTION AND ITS MANUFACTURING METHOD

(75) Inventors: Robert Baptist, Jarrie (FR); Fabrice Letertre, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 179 days.

(21) Appl. No.: 11/561,685

(22) Filed: Nov. 20, 2006

(65) Prior Publication Data

US 2007/0093009 A1    Apr. 26, 2007

Related U.S. Application Data

(62) Division of application No. 10/276,691, filed as application No. PCT/FR01/01603 on May 23, 2001, now abandoned.

(30) Foreign Application Priority Data

May 26, 2000  (FR)  .................................. 00 06761

(51) Int. Cl.
*H01L 21/00* (2006.01)
(52) U.S. Cl. .............................. 438/22; 438/24; 438/57; 438/455; 257/E21.517
(58) Field of Classification Search ......... 438/602–607, 438/22–24, 38, 34–36, 48, 56–57, 455–459; 257/E21.517
See application file for complete search history.

(56) References Cited

U.S. PATENT DOCUMENTS 3,853,650 A    12/1974  Hartlaub

| 4,279,690 | A | | 7/1981 | Dierschke |
| 4,797,890 | A | | 1/1989 | Inaba et al. |
| 5,259,247 | A | | 11/1993 | Bantien |
| 5,374,564 | A | * | 12/1994 | Bruel ........................ 438/455 |
| 5,383,993 | A | | 1/1995 | Katada et al. |
| 5,455,203 | A | | 10/1995 | Katada et al. |
| 5,864,171 | A | | 1/1999 | Ishikawa et al. |
| 6,139,760 | A | | 10/2000 | Shim et al. |
| 6,239,033 | B1 | * | 5/2001 | Kawai ........................ 438/693 |
| 6,448,102 | B1 | * | 9/2002 | Kneissl et al. ............... 438/46 |
| 2007/0119812 | A1 | | 5/2007 | Kerdiles et al. |

FOREIGN PATENT DOCUMENTS

| EP | 0 539 741 | 5/1993 |
| EP | 0 601 561 | 6/1994 |
| EP | 0 715 359 | 6/1996 |
| FR | 2 484 710 | 12/1981 |
| WO | 87 06060 | 10/1987 |

\* cited by examiner

*Primary Examiner*—H. Jey Tsai
(74) *Attorney, Agent, or Firm*—Oblon, Spivak, McClelland, Maier & Neustadt, L.L.P.

(57) ABSTRACT

A method for making a semiconductor device with vertical electron injection, including: transferring a monocrystalline thin film onto a first face of a support substrate; producing at least one electronic component from the monocrystalline thin film; forming at least one recess in a second face of the substrate to enable electric or electronic access to the electronic component through the monocrystalline thin film; and producing a vertical electron injector configured to inject electrons into the electronic component.

18 Claims, 4 Drawing Sheets

SEMICONDUCTOR DEVICE WITH VERTICAL ELECTRON INJECTION AND ITS MANUFACTURING METHOD

CROSS REFERENCE TO RELATED APPLICATIONS

This application is a divisional of U.S. application Ser. No. 10/276,691, filed Nov. 18, 2002, and is based upon and claims the benefit of priority to WIPO Application No. PCT/FR01/01603, filed May 23, 2001 and from the prior French Patent Application No. 00/06761, filed on May 26, 2000, the entire contents of each of which are incorporated herein by reference.

FIELD OF THE INVENTION

The present invention relates to a semiconductor device with vertical electron injection. It also concerns a manufacturing method for such a device.

The semiconductor device with vertical electron injection is produced in an active layer in semiconducting material with a small gap or a big gap. However, the invention proves to be of particular interest in the case of an active layer in semiconducting material with a big gap.

BACKGROUND OF THE INVENTION

Semiconductors are characterized by their forbidden band or gap separating the last filled states of the valence band and the following empty states in the conduction band. Among the semiconductors, one can distinguish between semiconductors with a small gap, such as silicon and germanium, and semiconductors with a big gap such as, for example, GaN and SiC.

At present it is extremely difficult or even impossible to obtain solid substrates in a semiconductor with a big gap. In the case of GaN for example, no solid substrate of electronic quality exists despite intense research carried out in this field. On the other hand, hetero-epitaxial GaN on a solid substrate in sapphire or in SiC exists. This technique was developed for production of blue diode type optoelectronic components.

Nonetheless, epitaxy of GaN on sapphire is made particularly delicate because of the difference in lattice structure existing between GaN and sapphire (of the order of 16%). Therefore, obtaining crystalline layers of sufficiently high quality for producing optoelectronic devices requires perfecting sophisticated epitaxy methods. The use of the sapphire substrate is essentially explained by its structural and chemical compatibility with GaN, its low cost and its availability under the form of large diameter substrate. The electrically insulating property of sapphire requires production, in the epitaxial GaN, of horizontal components with electrodes located in the front face.

The other method used for retail components is that of GaN on a solid SiC substrate. SiC substrates remain rare and very expensive. This is the method developed and marketed by the company of Cree Research Inc., profiting from the advantage it has of retailing the major part of SiC substrates. The interest of solid SiC for epitaxy and the production of devices with a GaN base is evident. First of all, the low difference in lattice structure (3.5%) between SiC and GaN makes it possible to simplify epitaxy methods while still producing layers with high crystalline quality. Furthermore, the use of a conducting SiC substrate makes it possible to produce a vertical component for passing current (that is, with an electrode on each face). This structure enables production of components of smaller size than those produced on an insulating substrate, which is of interest from the economic point of view. Moreover, the use of SiC, with its high thermal conductivity, makes it possible to adjust or lower the component temperature during its operation. This is an important point as far as performance, service life and reliability are concerned.

Other methods are also being studied, but their present state of development restricts them to laboratory use. The general approach consists of using a substrate of solid silicon in order to benefit from the low cost and large size of these substrates. Thus one can obtain GaN on SiC covering silicon. These techniques, developed under laboratory conditions, rely on the use of a film of epitaxial cubic SiC either on an SOI substrate or directly on a solid silicon substrate. This SiC layer must make it possible to facilitate epitaxy by reducing the difference in the lattice parameter between the GaN and the silicon, that is to arrive at a configuration of epitaxial GaN on SiC. Apart from the problem of producing epitaxial GaN, the first epitaxy of SiC poses significant technical problems. However, the growth of GaN on such a structure is of particular interest because it would make it possible to obtain GaN with cubic structure (sapphire obtains a hexagonal structure) which, because of its properties, is interesting for optoelectronic applications. For the moment this method is still at the research stage.

Finally, a more recent method relates to the direct epitaxy of GaN on silicon, without any buffer film of SiC. For this, one uses silicon (111). This approach, based on a principle equivalent to that adopted for epitaxy on sapphire, suffers at present from being far behind, relative to other techniques. Nonetheless, correct control of the material silicon makes it possible to envisage using electrically insulating or conducting epitaxial support substrates, leaving a certain freedom for the operating mode of the epitaxied device (vertical or horizontal).

The optoelectronic components produced on the above-mentioned materials therefore have either a lateral structure (with two electrodes located on the front face of the substrate), or a vertical structure with one electrode on the active layer (generally in GaN) and another electrode on the rear face of the solid substrate (in SiC, for example). According to the structure adopted, or imposed by the nature of the substrate, the size of the chip evidently varies. From a strictly economic point of view, the production of a vertically operational chip is clearly more advantageous because it makes it possible to produce more compact devices.

Furthermore, the nature of the substrate chosen for epitaxy has an influence on the performance of the device via the problem of heat dissipation during operation. From this point of view, solid SiC has a considerable advantage. The limitations recognized concerning devices produced on GaN supported by sapphire, are under study at present. Two methods are described in publications concerning the solution of this problem for sapphire. Each depends on eliminating the sapphire substrate after producing active epitaxial layers.

The first method depends on eliminating the sapphire substrate and producing a thick epitaxy of GaN (greater than 100 µm) at the rear face in order to obtain a self-supporting rigid membrane. This again means producing a GaN substrate. This approach makes it possible to produce a device with vertical operation and to dissipate the generated heat.

The second method depends on eliminating the sapphire substrate and adhering the active layer onto an electrically and thermally conducting sole (adhesion on a copper substrate, for example). Thus it would be possible to obtain a vertically operational device enabling dissipation of the produced heat.

Thus it can be understood that the SiC approach represents a very promising future for developing optoelectronic branches with a GaN base. The trend for growth techniques other than those on SiC is to produce devices with vertical current flow and to eliminate the generated heat as much as possible during operation of the device, whatsoever the epitaxial support. In the case of epitaxy on sapphire, this substrate only plays the role of epitaxial support and no longer limits the operation of devices because it can be eliminated.

SUMMARY OF THE INVENTION

The present invention proposes a new device that can be less costly than prior art solutions, for obtaining a semiconductor device with vertical electron injection.

A first aim of the invention consists of a vertical electron injection semiconductor device comprising a support substrate, a structure comprising at least one monocrystalline thin film transferred onto the support substrate and integral with the support substrate, at least one electronic component, the support substrate comprising at least one recess enabling electric or electronic access to the electronic component, through the monocrystalline thin film, the device also comprising means enabling vertical electron injection into the electronic component.

The structure may comprise at least one active layer formed by crystal growth of semiconducting material on the monocrystalline thin film, the electronic component being produced in said active layer. The epitaxial active layer is homogeneous or heterogeneous depending on the applications. The monocrystalline thin film can be an active layer, from which the electronic component is formed.

Possibly, the device can furthermore comprise a layer called an adhesion layer, situated between the support substrate and the structure and making it possible to solidify the monocrystalline thin film on the support, the adhesion layer allowing electric or electronic access to the electronic component. This adhesion layer can be in $SiO_2$.

Possibly, the adhesion layer is insulating and comprises at least one recess enabling electric or electronic access to the electronic component. The adhesion layer can also be conducting or semiconducting.

The monocrystalline thin film can comprise at least one recess enabling direct electric or electronic access to the electronic component.

Advantageously, the support substrate can be in silicon, in SiC, in AlN, in sapphire or in GaN, the monocrystalline thin film can be in SiC, in silicon, in GaN, in sapphire or in ZnO, and the active layer can comprise a semiconducting material selected from among the group consisting of SiC, GaN, the compounds III-V and their derivatives, and diamond.

The electronic component can comprise at least one junction produced from two semiconductors of the same nature or of different natures. It can comprise at least one metal-semiconductor type junction. Furthermore, it can comprise at least one stack of the semiconductor-metal-oxide type.

According to an embodiment of the invention, the means enabling vertical electron injection into the electronic component comprise an electrode set on the electronic component and an electrode set under the electronic component, in said recess enabling access to the electronic component. In this case, a ground can be provided in said recess, in contact with said electrode set under the component in order to constitute a heat sink.

According to another embodiment of the invention, the electron injection being achieved by means of an electron beam directed onto the electronic component by passing through said recess, the means enabling vertical electron injection comprise a conducting coating for guiding the electrons towards the electronic component.

According to a further embodiment of the invention, the recess in the support substrate comprises cells enabling electric or electronic access to electronic components formed from the structure.

The electronic component can be selected from among the group consisting of light emitters, light detectors, power electronic components and diodes.

The structure can be chosen to be vacuum sealed. In this case, if the electronic component is a component able to emit a light beam in response to an electron beam received, the monocrystalline thin film can be such that it allows passage of said electron beam. The structure can form a membrane that is deformable under the effect of a pressure difference, said electronic component being a component providing a signal representative of the deformation undergone by the membrane.

Another aspect of the invention includes of a manufacturing method for such a semiconducting device with vertical electron injection, including:

transferring the monocrystalline thin film onto a first face of the support substrate, producing at least one electronic component from the monocrystalline thin film, forming at least one recess in a second face of the substrate to allow electric or electronic access to the electronic component through the monocrystalline thin film, and producing a vertical electron injector configured to inject electrons into the electronic component.

The method can furthermore comprise a stage for formation of at least one active layer by crystal growth of semiconducting material on the monocrystalline thin film, the electronic component being produced in said active layer, the crystal growth being produced before or after transfer. If the thin film is an active layer, the electronic component can be formed from this monocrystalline thin film.

Possibly, the electronic component can be partly made before the transfer; especially when the active layer is produced before the transfer.

According to a particularly advantageous embodiment of the invention, the transfer stage of the monocrystalline thin film comprises the following operations:

defining said monocrystalline thin film in a substrate of monocrystalline material by introducing gaseous species into this substrate of monocrystalline material in order to create a fracture zone, the monocrystalline thin film being located between one face of the substrate in monocrystalline material and the cleavage zone, solidifying said monocrystalline thin film on the first face of the support substrate, and fracture separating the monocrystalline thin film from the rest of the substrate of monocrystalline material, the separation being produced before or after the solidifying operation, obtained for example by molecular adhesion.

Preferably, the transfer of said monocrystalline thin film is carried out through the intermediary of an adhesion layer. This adhesion layer can be in $SiO_2$.

According to an application variant, the producing a vertical electron injector configured to inject electrons into the electronic component includes depositing an electrode on the electronic component and depositing an electrode under the electronic component, in said recess enabling access to the electronic component. The method can then comprise the deposit of a ground in said recess, in contact with said electrode set under the component in order to constitute a heat sink.

According to another application variant, the method comprises the deposit of a conducting coating able to guide an electron beam directed onto the electronic component passing through said recess.

According to a further application variant, the method also comprises the formation of cells prolonging the recess in the support substrate to enable electric or electronic access to the electronic components formed from the structure.

BRIEF DESCRIPTION OF THE DRAWINGS

The invention will be understood better and other advantages and particularities will become clear by reading the description below, evidently given as a non-limiting example, and accompanied by the attached drawings in which.

DETAILED DESCRIPTION OF THE PREFERRED EMBODIMENTS

The manufacture of a semiconductor device with vertical electron injection according to the invention comprises the transfer of a monocrystalline thin film of very high crystalline quality (semiconducting or not, insulating or electrically conducting) onto the front face of a substrate, semiconducting or not. This transfer can be carried out through the intermediary of an insulating thin film, metallic or semiconducting. The required active layer or layers are obtained by crystal growth before or after transfer. One or several electronic components are thus formed. The rear face of the substrate is machined or micro-machined locally in order to create a membrane. The monocrystalline thin film can possibly be thinned.

According to an embodiment of the invention, the active layer and the monocrystalline thin film form a single and same layer.

The electronic component or components can be manufactured before or after the formation of the membrane. Nonetheless, it is preferable to manufacture the electronic components before forming the membrane in order to relax the mechanic stresses in the device during manufacture.

Figure 1A:
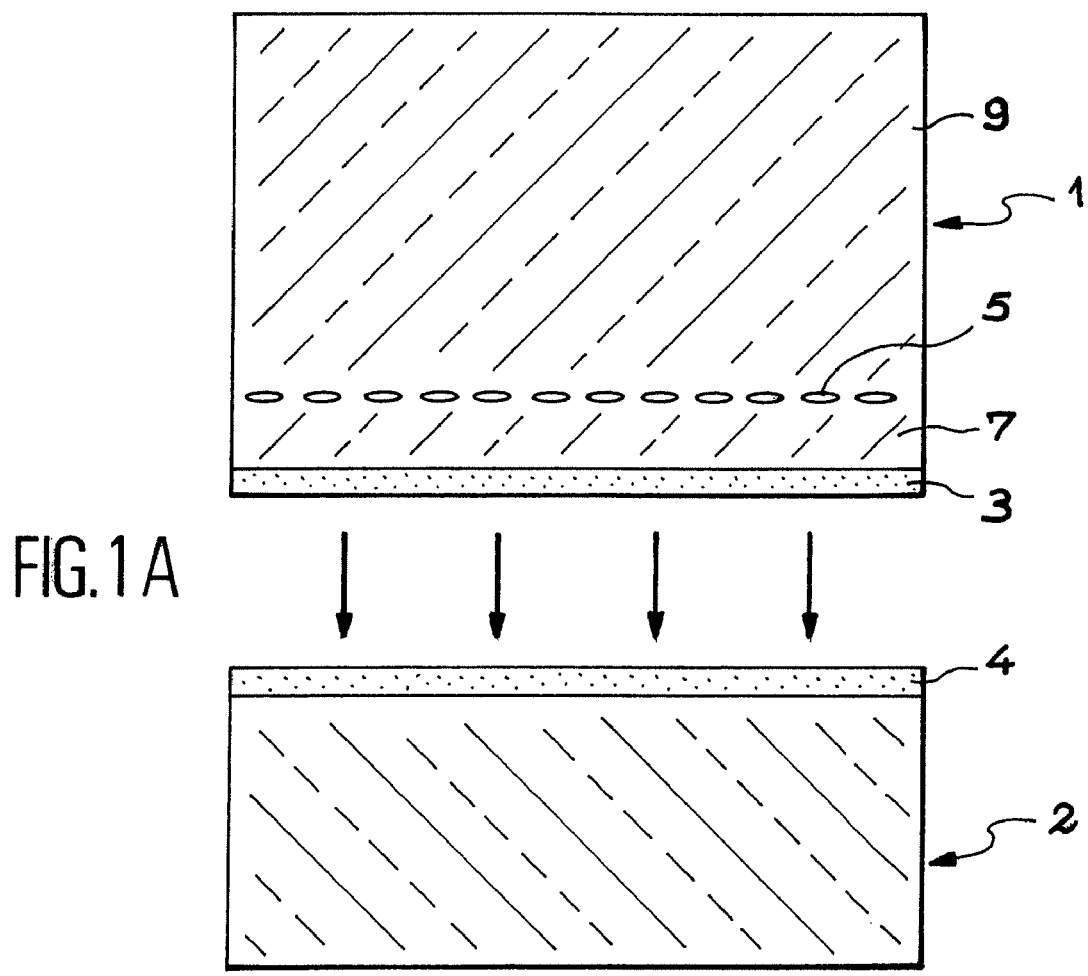
FIGS. 1A to 1E show the main stages of a manufacturing method of a semiconductor device with vertical electron injection according to the invention.
Figure 1B:
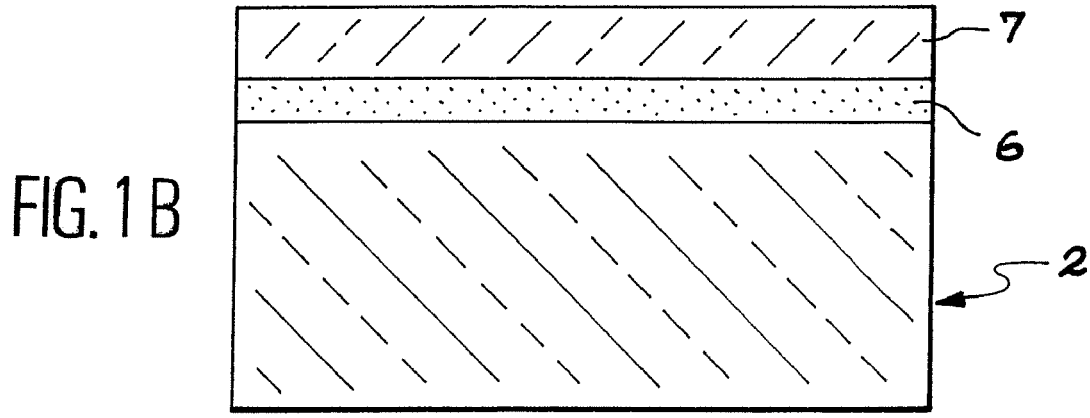

Advantageously, transfer of the monocrystalline thin film can be carried out using the method known under the name of Smartcut® and described in particular in the document FR-A-2 681 472 (corresponding to the U.S. Pat. No. 5,374,564). FIGS. 1A and 1B show this transfer method.

FIG. 1A shows the fixation of a first substrate 1 in SiC onto a second substrate 2 in silicon, with an adhesion interface. The substrate 1 possesses a layer 3 of $SiO_2$ on its junction face with the substrate 2. An ionic implantation produced through this face has made it possible to create a layer of micro-cavities 5 separating the substrate 1 into a thin film 7 and a remainder part 9 of the substrate. In this example, the substrate 2 also possesses a layer 4 of $SiO_2$ on its junction face with the substrate 1. Nonetheless, the two opposite faces can be of different nature on condition that adhesion is possible.

Advantageously, the junction of the two substrates is obtained by molecular adhesion. Once the junction has been established, one proceeds to the fracture of the substrate 1 along the zone of micro-cavities 5. This fracture can be obtained by means of heat treatment and/or by application of mechanical stresses. The fracture provides the structure shown in FIG. 1B and constituted of a support substrate 2 in silicon supporting first of all a layer 6 in $SiO_2$ (formed by the combination of layers 3 and 4), and then a layer 7 of SiC. It would also be possible to transfer the layer 7 from its initial substrate 9 to the support substrate 2 via at least one intermediary substrate.

Figure 1C:
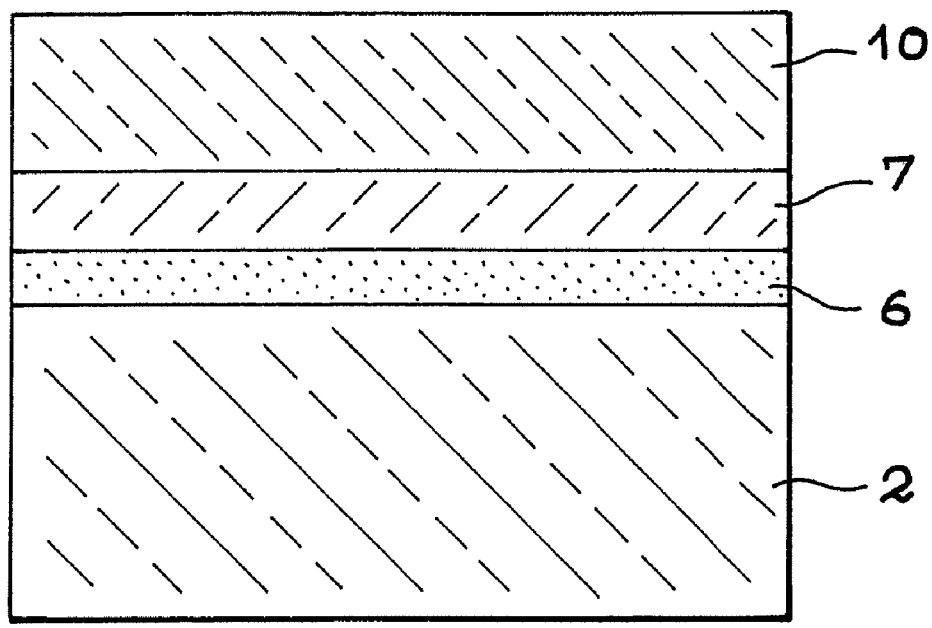

A thin film 10 of GaN is then epitaxied on the layer 7 of SiC with its free face prepared for this. This is shown in FIG. 1C. The layer 10 of GaN constitutes the active layer in which the electronic component can be formed.

As above-mentioned, the layer 10 could have been produced before transfer. In this case, the transfer of the structure formed by the layer 7 and the layer 10 must be made either by means of an intermediary support, or directly, the layer 7 needing to be eliminated for certain applications.

Figure 1D:
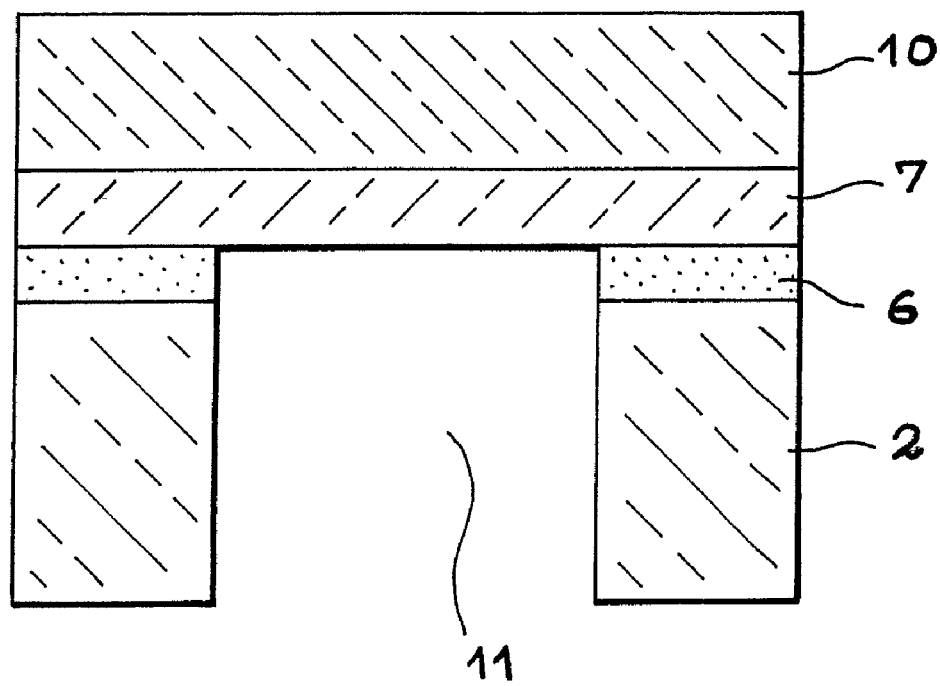

In order to obtain electric or electronic access to the component produced in the layer 10, a recess is made starting from the rear face of the substrate 2. FIG. 1D shows that the recess 11 made in the substrate 2 is prolonged into the layer 6 of $SiO_2$, as far as the layer 7 of SiC. This layer 7 could also possibly be recessed.

Taking into account the different applications aimed at by the invention, at least two cases of electron excitation can be distinguished. The first case concerns an electron excitation through vertical passage of the current into the component formed in the active layer by two electrodes, one of these electrodes being deposited on the top of the component and the other being deposited under the component. The second case involves electron excitation by vertical passage of current in the component following electron injection by electron bombardment on the rear face of the device.

Figure 1E:
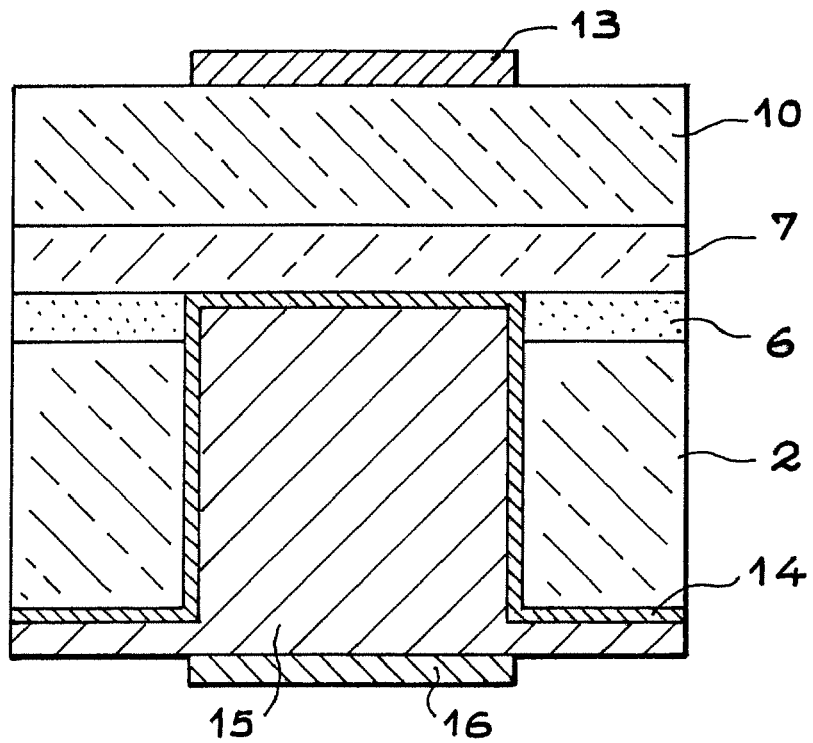

The first case requires the presence of electrodes on top of and underneath the device as shown in FIG. 1E. An electrode 13 has been formed on the front face of the electronic component produced in the layer 10. A conducting material 14 is deposited on the rear face of the device. It covers the recessed rear face of the substrate 2 as well as the apparent face of the layer 7 of SiC. The electric connection with the component is obtained through the layer 7 of SiC which is electrically conducting. Possibly, the recess is filled with a conducting material advantageously forming a heat sink 15, making it possible to evacuate the heat produced by the device during operation. An electrode 16 is deposited on the heat sink 15 to allow joining an electric connection wire. In the absence of the material 15, the second electrode is formed by the conducting material 14.

Figure 2:
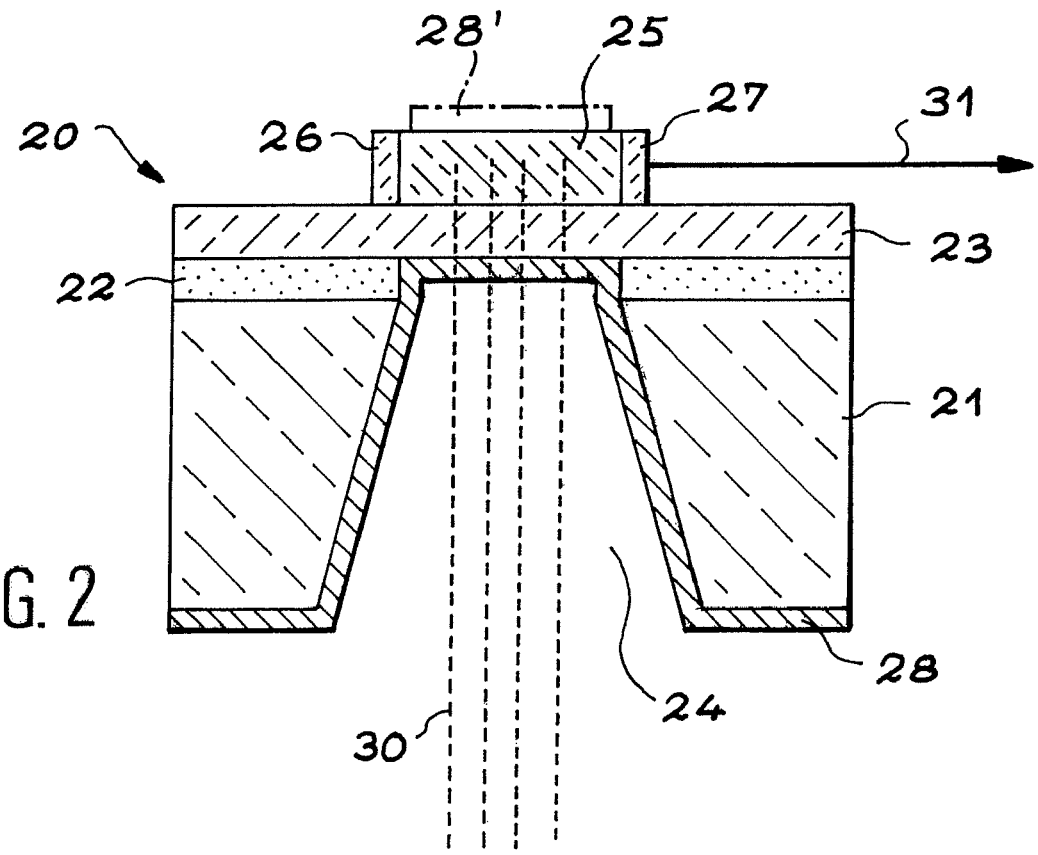
FIG. 2 shows, in cross-section, another semiconductor device with vertical electron injection according to the invention.

FIG. 2 shows, in cross section, a device 20 according to the invention and with electron excitation by vertical passage of current through the device, the current being due to electron bombardment directed towards the rear face of the device.

The device 20 is produced as above, from a stacked structure comprising a substrate 21 in silicon, a layer 22 of $SiO_2$, and a thin film 23 of SiC. A recess 24 is made in the rear face of the substrate 21 as far as the thin film 23 of SiC. A layer of GaN has been epitaxied from the layer 23 of SiC and an electronic component 25 has been formed from the layer of GaN. In the example shown, the component 25 is a laser source. It is equipped on two opposite flanks with mirrors 26 and 27 enabling optical amplification. The production of such mirrors is known to those skilled in the art.

In this embodiment, the recess is of truncated shape with circular or polygonal cross sections. In order to guide an electron beam 30, arriving on the rear face of the device, towards the component 25, a conducting layer 28 is deposited on the rear face of the device. This conducting layer 28 acts as an anode relative to the electron beam and must allow it to pass. Possibly, a conducting layer 28 can be deposited on the component 25 and connected electrically to the conducting layer 28 in order to define a potential and to direct the injected electrons more efficiently towards the rear face of the device. In response to the excitation by the electron beam 30, the component 25 will emit a laser beam 31.

Figure 3:
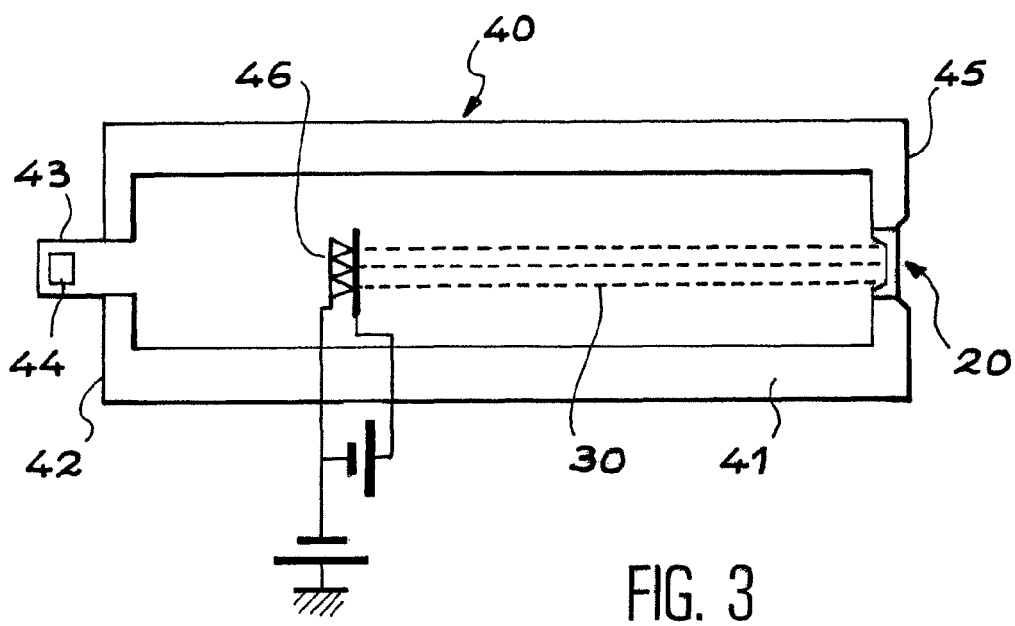
FIG. 3 shows the device of FIG. 2 installed on equipment provided with a cathode with micro-points.

FIG. 3 shows, as an example of an embodiment, the device 20 shown in FIG. 2 installed on equipment 40 provided with a micro-point cathode. The equipment 40 comprises a tubular chamber 41 with one end 42 provided with a tip 43 through which the vacuum is formed in the chamber 41. The tip 43 can contain a getter 44. The other end 45 of the chamber 41 comprises an opening which is closed by the device 20, the recess 24 of the device 20 (see FIG. 2) being turned towards the inside of the chamber 41.

Inside the chamber 41, the equipment 40 comprises a cathode with micro-points 46 supplied live in appropriate fashion relative to the earth. The conducting layer 28 of the device 20 is also connected to the earth. When in use, the cathode with micropoints 46 emits an electron beam 30 in the direction of the device 20.

As an example, the micro-points can be brought to −10 kV, the extraction grid of the cathode to about 50 or 100 V above this voltage, that is to −9950 or −9900 V. The conducting layer 28 of the rear face of the device 20 ensures that the voltage is well defined and that therefore the electrons will be certain to enter the recess of the device, crossing the thin film in SiC and penetrating the component 25.

The thin film 23 of the device 20 provided with the conducting layer 28 and the component 25 plays the role of a sealed vacuum membrane in this application. It is permeable to electrons and serves as epitaxial substrate. The device has the advantages of compactness and of integration into a piece of equipment.

Figure 4:
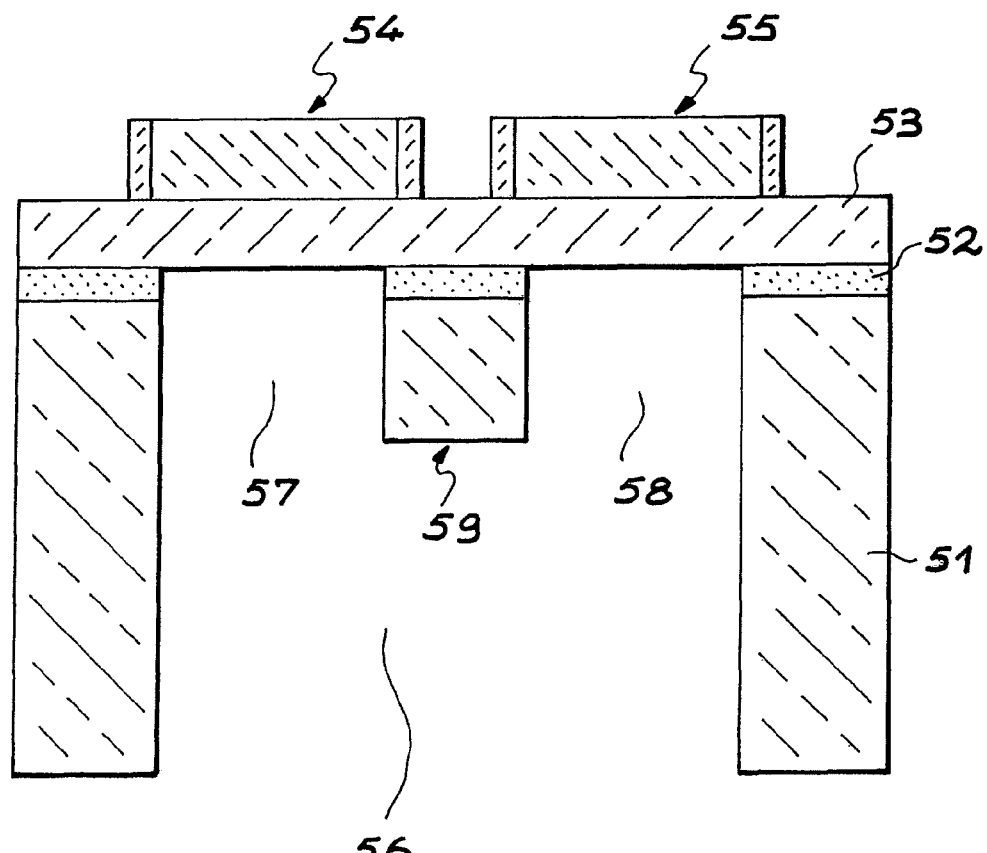
FIG. 4 shows, in cross-section, another semiconductor device with vertical electron injection and with cell structure, according to the invention.

FIG. 4 shows, in cross section, another semiconductor device with vertical electron injection and cell structure, according to the invention.

The device of FIG. 4 comprises, superposed, a substrate 51 in silicon, a layer 52 of $SiO_2$ and a thin film 53 of SiC. A layer of GaN has been epitaxied from the layer of SiC and two electronic components 54 and 55 (laser sources here) have been formed from the layer of GaN.

A recess 56 has been made from the rear face of the substrate 51. This recess is prolonged by two cells 57 and 58 revealing parts of the thin film 53 of SiC situated under the components 54 and 55. Between the cells 57 and 58 there exists a part 59 of the initial structure acting as strengthener. This strengthener enables the membrane, constituted by the free part of the thin film 53, to be made mechanically rigid. Thus one avoids risks of the membrane bursting when put under vacuum in equipment such as that of FIG. 3. It is to be noted that the cross section of the cells can be hexagonal just like a honeycomb element.

In particular, the invention has the following advantages. It makes it possible to manufacture a semiconductor device, especially with a big gap, electronic or optoelectronic, on a low cost substrate, for example in silicon, using well known techniques for transfer of layers, deep engraving and metallizing. It allows integration of an electronic device on a monocrystalline membrane. It enables the creation of a vacuum sealed membrane, permeable to an electron beam focused on the rear face of the membrane whose front face supports one or several electronic components. It enables the production of vertical semiconductor devices on a substrate which is not necessarily an electrical conductor throughout the whole of its volume. The substrate can possibly possess an integrated heat sink. The manufacture of vertical structure components allows a reduction in the size of components. The invention makes it possible to manufacture vertical semiconductor devices with low electrical resistance through replacement of the solid substrate by a semiconducting thin film. It makes it possible to integrate a laser on a micro-machined torch through the intermediary of a membrane which assures a three-fold role: sealing, permeability to electrons, and epitaxial substrate for the GaN.

What is claimed is:

1. A manufacturing method for a semiconductor device with vertical electron injection, comprising the following steps:
   transferring a monocrystalline thin film onto a first face of a support substrate, said transferring step including putting into close contact a face of the monocrystalline thin film to the first face of the support substrate and bonding the monocrystalline thin film to the support substrate by molecular adhesion;
   producing at least one electronic component from a structure including the monocrystalline thin film;
   forming at least one recess in a second face of the support substrate to enable electric or electronic access to the electronic component through the at least one monocrystalline thin film; and
   producing a vertical electron injector configured to inject electrons into the at least one electronic component.

2. The method according to claim 1, further comprising:
   forming at least one active layer by crystal growth of semiconducting material on the monocrystalline thin film, the at least one electronic component being produced in the active layer, the crystal growth being realized before or after transfer.

3. The method according to claim 1, further comprising:
   producing the at least one electronic component from the monocrystalline thin film which is an active layer.

4. The method according to claim 1, wherein the transferring step comprises, before putting into close contact the face of the monocrystalline thin film to the first face of the support substrate:
   defining the monocrystalline thin film in a substrate of monocrystalline material by introducing gaseous species into the substrate of monocrystalline material to create a fracture zone, the monocrystalline thin film being located between one face of the substrate of monocrystalline material and a fracture zone; and
   fracture separating the monocrystalline thin film from a rest of the substrate of monocrystalline material, the separating being produced before or after the bonding.

5. The method according to claim 1, wherein the transferring step of the monocrystalline thin film is carried out through an intermediary of an adhesion layer.

6. The method according to claim 1, wherein the transferring step of the monocrystalline thin film is realized on a first face of a support substrate in silicon.

7. The method according to claim 1, wherein the transferring step includes transferring a thin film of monocrystalline SiC.

8. The method according to claim 5, wherein the transferring step of the monocrystalline thin film is carried out with an intermediary of an adhesion layer in $SiO_2$.

9. The method according to claim 2, wherein forming at least one active layer includes forming an active layer by crystal growth on a layer of semiconducting material selected from the group consisting of SiC, GaN, compounds III-V and their derivatives, and diamond.

10. The method according to claim 1, wherein producing a vertical electron injector configured to inject electrons into the at least one electronic component includes depositing a first electrode on the at least one electronic component and depositing a second electrode under the at least one electronic component in the recess enabling access to the at least one electronic component.

11. The method according to claim 10, further comprising:
depositing a mass in the recess, in contact with the electrode set under the component, to constitute a heat sink.

12. The method according to claim 1, further comprising:
depositing a conducting coating capable of guiding an electron beam directed onto the at least one electronic component passing in the recess.

13. The method according to claim 1, further comprising:
forming cells prolonging the recess of the support substrate to allow the electric or electronic access to electronic components formed from the structure including the monocrystalline thin film.

14. The method according to claim 1, wherein the step of producing at least one electronic component includes producing a component selected from the group consisting of light emitters, light detectors, power electronic components, and diodes.

15. The method according to claim 1, wherein the step of transferring a monocrystalline thin film includes transferring a monocrystalline thin film such that the structure is vacuum sealed.

16. The method according to claim 15, wherein the step of transferring a monocrystalline thin film includes transferring a monocrystalline thin film configured to be crossed by an electron beam.

17. The method according to claim 15, wherein the step of transferring a monocrystalline thin film includes transferring a monocrystalline thin film such that the structure forms a membrane deformable under a pressure difference, and the step of producing at least one electronic component includes producing a component providing a signal indicative of the deformation undergone by the membrane.

18. The method according to claim 7, wherein the forming at least one recess in the second face of the support substrate includes forming at least one recess in the thin film of monocrystalline SiC.

* * * * *